(12) United States Patent
Song et al.

(10) Patent No.: US 7,650,113 B2
(45) Date of Patent: Jan. 19, 2010

(54) APPARATUS FOR RECEIVING WIDE-BAND PULSE SIGNAL IN COMMUNICATION CHANNEL USING HUMAN BODY

(75) Inventors: Seong-Jun Song, Daejeon (KR); Hoi-Jun Yoo, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 541 days.

(21) Appl. No.: 11/714,110

(22) Filed: Mar. 6, 2007

(65) Prior Publication Data
US 2007/0211828 A1 Sep. 13, 2007

(30) Foreign Application Priority Data
Mar. 7, 2006 (KR) .................. 10-2006-0021419

(51) Int. Cl.
*H04B 1/00* (2006.01)
(52) U.S. Cl. .................... 455/41.2; 455/130
(58) Field of Classification Search .............. None
See application file for complete search history.

(56) References Cited
U.S. PATENT DOCUMENTS
6,854,030 B2 2/2005 Perino et al.

2007/0190940 A1* 8/2007 Lee et al. .............. 455/41.2
2007/0281614 A1* 12/2007 Oliver et al. ............ 455/41.2
2009/0103643 A1* 4/2009 Hyoung et al. .......... 375/260

OTHER PUBLICATIONS

Lei Luo et al., "3 Gb/s AC Coupled Chip-to-Chip Communication Using a Low Swing Pulse Receiver," IEEE Journal of Solid-State Circuits, vol. 41, No. 1, pp. 287-296, Jan. 2006.

* cited by examiner

*Primary Examiner*—Thanh C Le
(74) *Attorney, Agent, or Firm*—Oliff & Berridge, PLC (57) ABSTRACT

Disclosed herein is an apparatus for receiving a wide-band pulse signal in a communication channel using a human body. When a weak wide-band pulse signal, which is output from a communication channel using a human body as a data transmission medium, is restored to a digital signal, it is possible to accomplish low power consumption and high data transmission rate using a wide-band symmetrical triggering technology using 50-$\Omega$ impedance matching, wide-band amplification and symmetrical threshold voltages. In addition, since only a single signal electrode is used, it is possible to provide an apparatus having usability, wearability and miniaturization. In addition, it is possible to remove necessities of an external reference voltage to reduce area consumption and to simply adjust a feedback resistor to easily adjust the reception sensitivity according to a communication distance.

12 Claims, 8 Drawing Sheets

FIG. 1

*(Prior Art)*

FIG. 2

*(Prior Art)*

APPARATUS FOR RECEIVING WIDE-BAND PULSE SIGNAL IN COMMUNICATION CHANNEL USING HUMAN BODY

BACKGROUND OF THE INVENTION

1. Field of the Invention

The present invention relates to an apparatus for receiving a wide-band pulse signal in a communication channel using a human body, and more particularly, to an apparatus for receiving a wide-band pulse signal in a communication channel using a human body, which is capable of performing high-speed communication with low power consumption using a wide-band symmetrical triggering technology using 50-Ω impedance matching, wide-band amplification and symmetrical threshold voltages, when the weak wide-band pulse signal output from the communication channel using the human body as a data transmission medium is restored to a digital signal.

2. Description of the Related Art

Recently, in a next-generation personal computer (PC) or a wearable computing system, studies on a communication channel using a human body as a data transmission medium are ongoing.

Since a human body has a component similar to a saline solution having 0.9% sodium chloride and a weak conductivity which varies depending on a frequency, the human body can transmit an electric signal. In addition, the human body has a loss of about 10 to 20 dB due to a resistive component of the human body.

When a digital signal is directly applied to the human body using a single signal electrode and 50-Ω transmission and reception impedances, a signal which is detected in a reception electrode includes positive and negative pulse signals having a width of about 5 to 10 ns without a DC offset. This is because the human body has a band-pass filter characteristic of about 100 MHz with respect to a single transmission/reception electrode as frequency characteristics, ground terminals of a transmission apparatus and a reception apparatus are separated from each other and a signal of less than 10 kHz and including a DC signal is not easily transmitted through the human body.

Since electric characteristics of the human body which appear when using the single signal electrode and the 50-Ω transmission and reception impedances are similar to the characteristics which appear in a capacitively coupled interface on a printed circuit board (PCB), a receiving method and apparatus used in a capacitively or AC coupled interface can be employed in even a communication channel using a human body as a data transmission medium.

Accordingly, a method and apparatus for restoring a pulse signal to a digital signal have been mainly used in the capacitively coupled interface which is developed for high-speed data transmission between chips mounted on the PCB.

Recently, a capacitive coupling interface for a high-speed memory bus I/O interface is registered by Perino (see Donald V. Perino, et al., "Integrated Circuit Device Having a Capacitive Coupling Element", U.S. Pat. No. 6,854,030, Feb. 8, 2005, FIG. 15).

Figure 1:
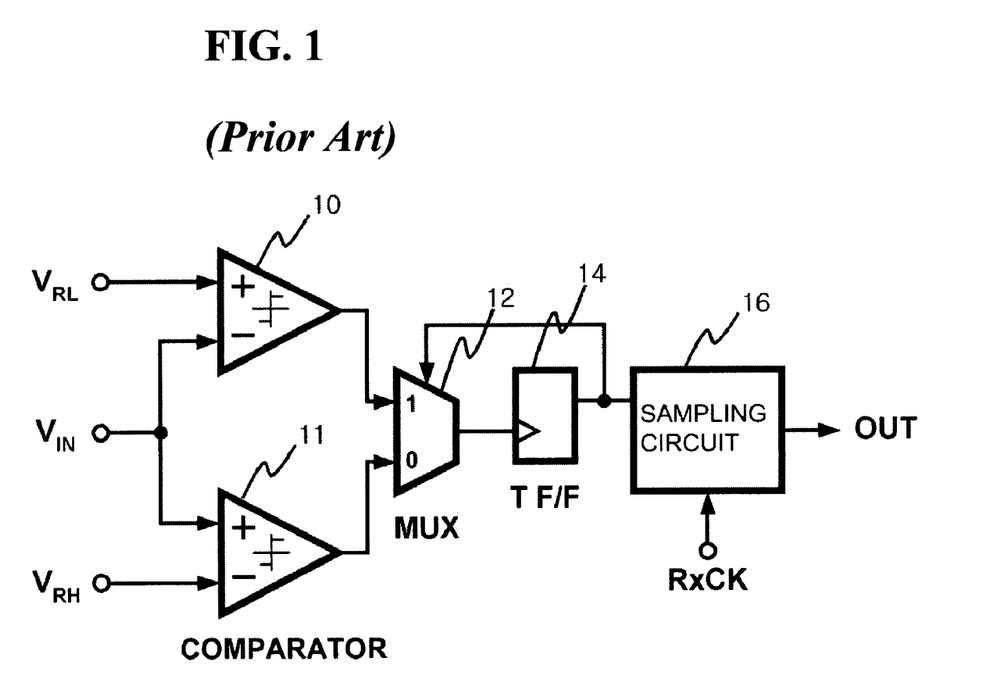
FIG. 1 is a circuit diagram of a pulse receiver using comparators necessary for a capacitive coupling interface.

FIG. 1 is a circuit diagram of a pulse receiver using a comparator necessary for a capacitive coupling interface.

As shown, an input pulse signal is compared with negative and positive threshold voltages $V_{RL}$ and $V_{RH}$ using two comparators 10 and 11 and the output signals of the comparators 10 and 11 are sequentially selected by a multiplexor 12 using a clock signal of a flip-flop 14, thereby restoring the pulse signal to the digital signal. Then, a sampling circuit 16, which operates using the clock signal of the reception unit, converts the restored digital signal into a signal having a same phase as a clock signal of a reception unit.

Since the pulse receiver using the comparators has a simple circuit configuration, power consumed for restoring the pulse signal to the digital signal is low. However, the input pulse signal must have a DC bias and the threshold voltages $V_{RL}$ and $V_{RH}$ are further required.

In addition, the comparators which operate at a high speed and output the digital output signals are required. Since the comparator has restrictive hysteresis characteristics, there is a limitation in reception sensitivity.

Accordingly, in order to overcome the limitation in the reception sensitivity, an interface technology using a receiver having high reception sensitivity is published by Luo (see Lei Luo, et al., "3 Gb/s AC Coupled Chip-to-Chip Communication Using a Low Swing Pulse Receiver", IEEE Journal of Solid-State Circuit, vol. 41, no. 1, pp. 287-296, January 2006, FIG. 11).

Figure 2:
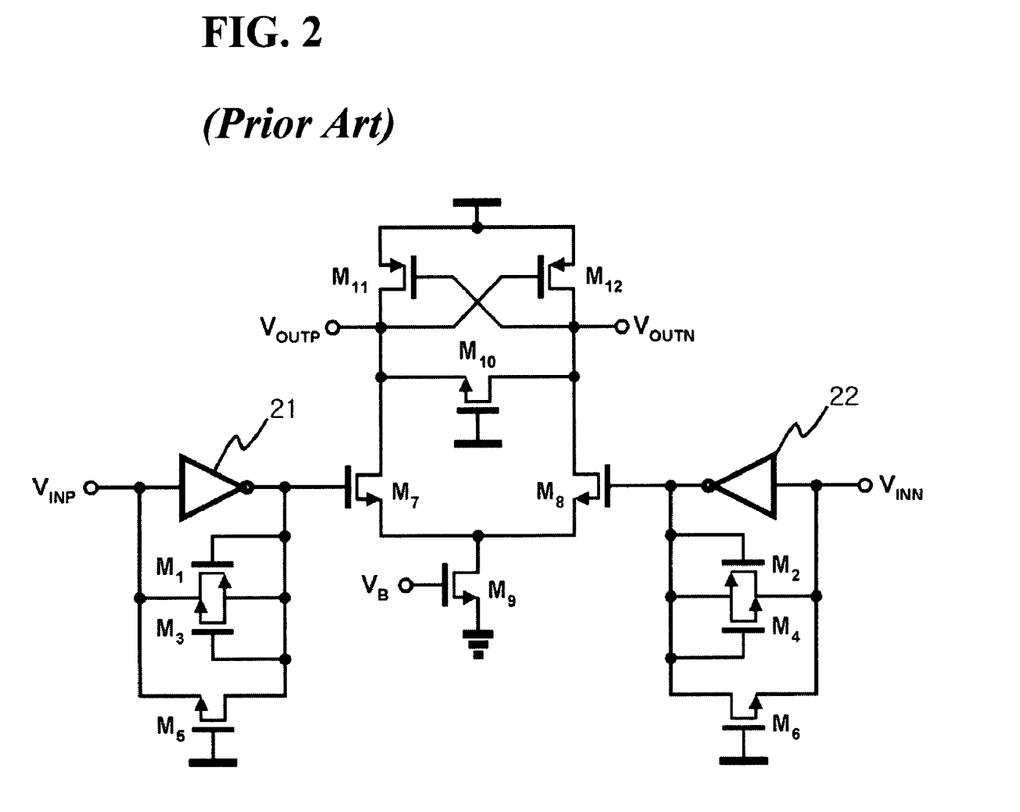
FIG. 2 is a circuit diagram of a pulse receiver using inverters each having a feedback function, which is developed for an AC coupled interface.

FIG. 2 is a circuit diagram of a pulse receiver using inverters each having a feedback function, which is developed for an AC coupled interface.

As shown, since a DC signal is not transmitted in the AC coupled interface, the receiver must have a self-bias function and an input pulse signal must be amplified and converted into a digital signal.

At this time, two inverters 21 and 22 have negative feedback loops composed of transistors $M_1$ to $M_6$. The transistors $M_1$ to $M_4$ are connected in a diode form and serve to restrict the output levels of the inverters 21 and 22 and to hold a bias voltage to some extent. In order to stabilize the bias voltage regardless of the width or the amplitude of the input pulse signal or a data pattern, the transistors $M_5$ to $M_6$ are connected to a voltage $V_{DD}$ such that a weak uniform feedback is applied. Transistors $M_7$ to $M_9$ are connected to an input terminal of a differential amplifier so as to amplify the input pulse signal and transistors $M_{11}$ to $M_{12}$ are cross-coupled PMOS loads and function as a latch circuit which does not requires a clock signal in order to restore the pulse signal to the digital signal. A transistor $M_{10}$ is a clamping NMOS for restricting the amplitude of the output signal and sufficiently latching a signal having a small width.

Accordingly, such a receiver can convert the pulse signal into the digital signal at a high speed using the inverters 21 and 22 having the simple feedback loops while increasing the reception sensitivity.

However, since the receiver must operate using differential input signals, the receiver is not suitable for a communication channel using the human body as a single transmission line. Due to the characteristics of the inverter which operates digitally and has a restrictive feedback function, the receiver can obtain reception sensitivity of at most 120 $mV_{pp}$.

SUMMARY OF THE INVENTION

Therefore, the present invention has been made in view of the above problems, and it is an object of the present invention to provide an apparatus for receiving a wide-band pulse signal in a communication channel using a human body, which is capable of solving problems of the prior art, such differential signal transmission, a limitation in reception sensitivity and necessities of a high-speed comparator which requires a DC bias and threshold voltages, and performing high-speed communication with low power consumption using a wide-band symmetrical triggering technology using 50-Ω impedance matching, wide-band amplification and symmetrical threshold voltages, when the weak wide-band pulse signal output from the communication channel using the human body as a data transmission medium is restored to a digital signal.

In accordance with an aspect of the present invention, the above and other objects can be accomplished by the provision of an apparatus for receiving a wide-band pulse signal in a communication channel using a human body, comprising: a bias circuit which sets a DC bias with respect to the wide-band pulse signal transmitted through the human body as a data transmission medium; a wide-band pre-amplifier which provides a high voltage gain to the pulse signal having the DC bias set by the bias circuit over a wide range of frequency band; a Schmitt trigger which triggers the pulse signal amplified by the wide-band pre-amplifier to a stable voltage state using symmetrical threshold voltages; and an inversion buffer which inverts the pulse signal triggered by the Schmitt trigger and outputs a digital signal having the same phase as the received signal.

Only one electrode may be connected to an input terminal such that the wide-band pulse signal transmitted through the human body as the data transmission medium is received.

A reception input impedance of the bias circuit may be 50Ω.

The apparatus may further comprise an AC coupled capacitor which is in series connected to an input terminal for receiving the signal transmitted through the human body as the data transmission medium.

The bias circuit may comprise a DC bias generation circuit which generates the DC bias; a pair of complementary source followers which is controlled by the DC bias generation circuit; and a pull-up resistor and a pull-down resistor which are connected between respective output terminals of the source followers in series, and a node between the pull-up resistor and the pull-down resistor may be connected to an input terminal of the wide-band pre-amplifier.

The wide-band pre-amplifier may comprise a non-inversion operational amplifier which adjusts a feedback resistor to adjust the voltage gain.

The Schmitt trigger may comprise an inversion operational amplifier of which an inversion terminal is connected to an output terminal of the wide-band pre-amplifier, two resistors having a same value may be connected between a power supply voltage and ground, a node between the two resistors may be connected to a non-inversion terminal of the inversion operational amplifier and a feedback resistor, and the inversion operational amplifier may adjust the feedback resistor to adjust the threshold voltages.

The triggered pulse signal may have a duty cycle of 50%.

The operational amplifiers of the wide-band pre-amplifier and the Schmitt trigger may have a fully complementary folded cascode structure.

Each of the operational amplifiers may comprise a source follower input unit; a gain unit including a fully complementary folded differential input pair for amplifying a signal input through the source follower input unit and a low-voltage cascode load; and a class-AB output unit which outputs a signal amplified by the gain unit.

In a wide-band symmetrical triggering technology using symmetrical threshold voltages, pulse signals, which have a value corresponding to a half of a power supply voltage and are separated by a same interval in a wide frequency band, are triggered to a digital signal by positive and negative threshold voltages by dividing a signal amplification function and a comparison function using a pre-amplifier which operation in a wide band and has a high voltage gain and a Schmitt trigger which operates at a high speed. According to the present invention, the pulse signals transmitted through a human body as a data transmission medium are sufficiently amplified and symmetrical threshold voltages which are internally generated are adjusted such that positive and negative pulse signals are triggered and converted into a digital signal. Accordingly, it is possible to significantly reduce reception sensitivity in a range which is allowed by the pre-amplifier and to provide optimal reception sensitivity according to a communication distance. Since a wide-band operation is possible, it is possible to obtain a high data transmission rate with low power consumption regardless of a data transmission rate.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described more fully with reference to the accompanying drawings, in which exemplary embodiments of the invention are shown. The same parts as the prior art are denoted by the same reference numerals. It is to be understood that the following embodiments are disclosed for illustrative purposes only. The present invention may be embodied in many different forms and should not be construed as being limited to the embodiments set forth herein.

Figure 3:
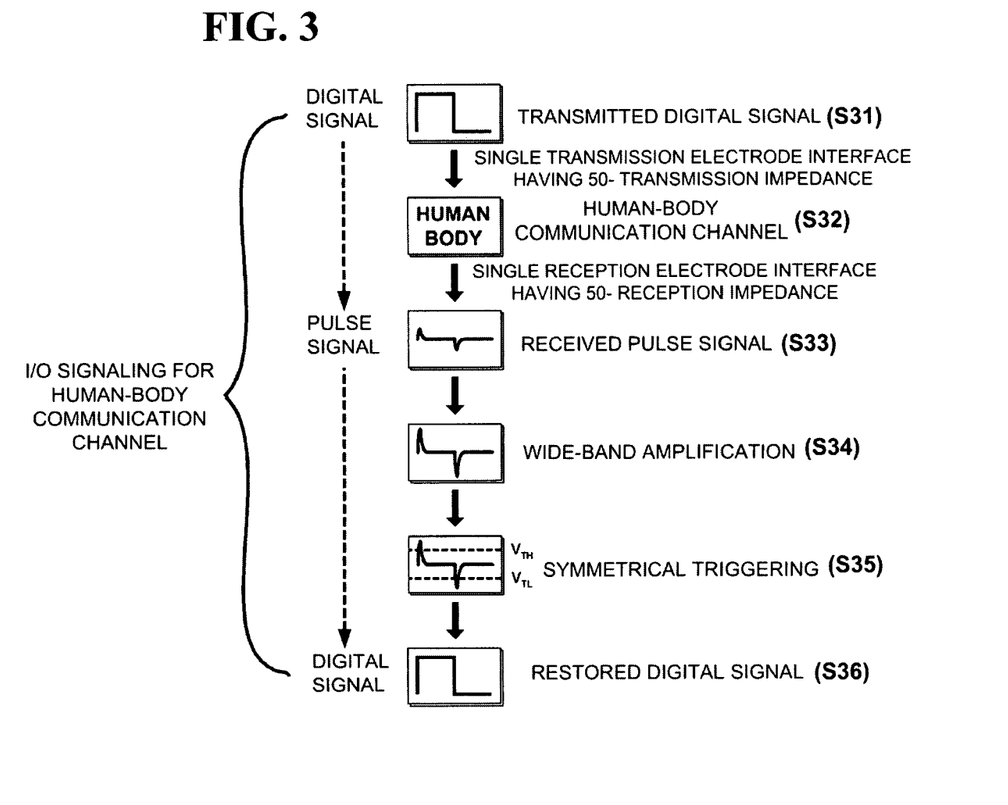
FIG. 3 is a flowchart illustrating a method for restoring a weak pulse signal received when a digital signal is applied to a human body, which is a human-body communication channel, to a digital signal.

FIG. 3 is a flowchart illustrating a method for restoring a weak pulse signal received when a digital signal is applied to a human body, which is a human-body communication channel, to a digital signal.

First, when interfaces each having a single signal electrode and a 50-Ω transmission/reception impedance apply to a human-body communication channel, the human body functions as a band-pass filter of about 100 MHz. Since there is no ground path between a resistance component of the human body and the transmission and reception impedances and the interfaces are separated from each other, the human body has electric characteristics that a loss of about 50 to 60 dB and a DC signal is not transmitted.

Due to such electric characteristics of the human body and the interface applied to the human body, when a digital signal is directly applied to the human body using a single transmission electrode interface having a 50-Ω transmission impedance (S31), the digital signal is transmitted through the human-body communication channel (S32) such that an output signal of a human-body communication channel, that is, a signal received by a single reception electrode interface having a 50-Ω reception impedance, which contacts the human body, becomes a very weak pulse signal having an amplitude less than 10 mV$_{pp}$. The positive and negative wide-band pulse signals having a DC bias of 0 and a pulse width of about 5 to 10 ns are obtained (S33).

As a method for restoring the pulse signal to the digital signal, a wide-band symmetrical triggering technology is used in the present invention. In order to trigger the received pulse signal, the received pulse signal is amplified in a wide band (S34) and symmetrically triggered using symmetrical threshold voltages (S35).

When the triggered signal is inverted, the digital signal having a duty cycle of 50% is restored (S36).

Such a method may provide I/O signaling for performing high-speed data communication in the human-body communication channel with low power consumption.

Figure 4:
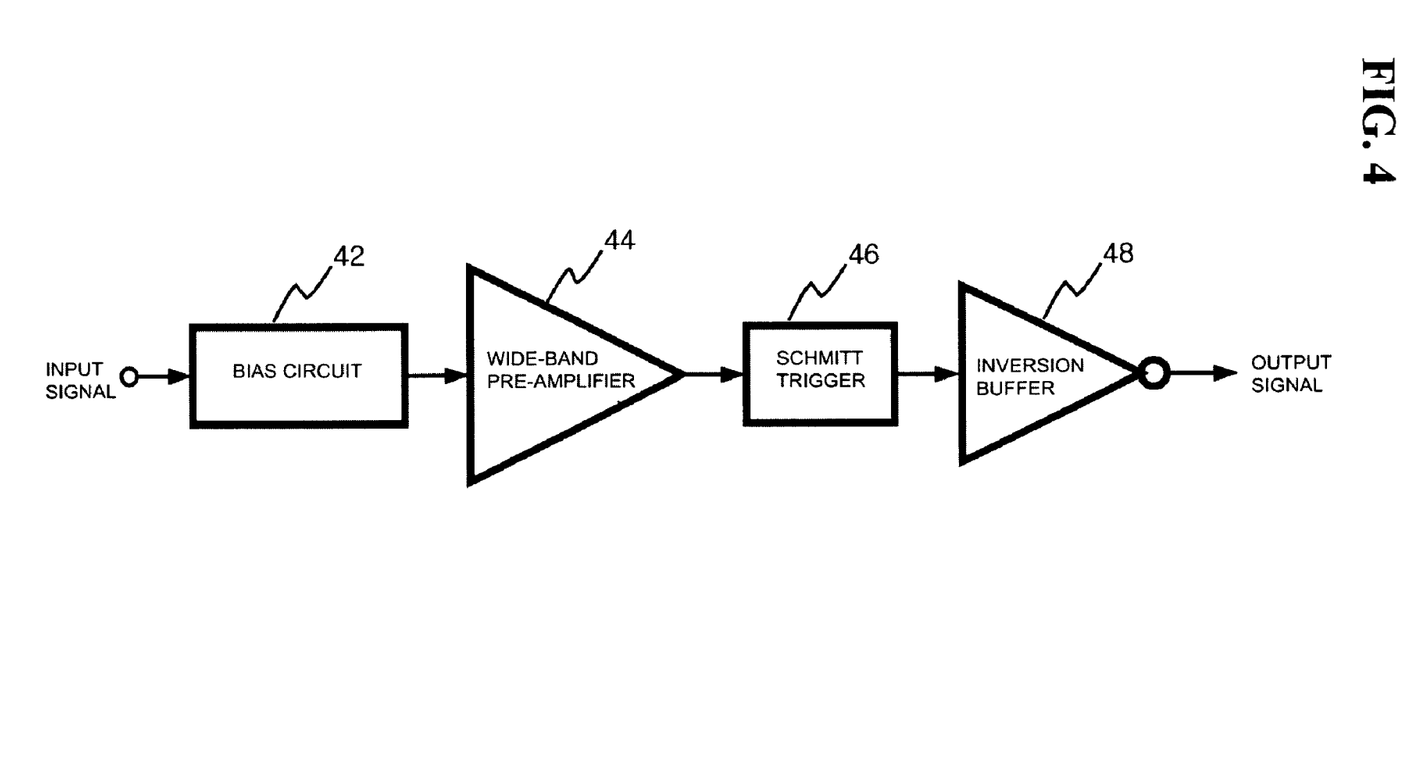
FIG. 4 is a block diagram showing an apparatus for receiving a wide-band pulse signal in a communication channel using a human body according to the present invention.

FIG. 4 is a block diagram showing an apparatus for receiving a wide-band pulse signal in a communication channel using a human body according to the present invention.

As shown, the receiving apparatus according to the present invention functions as an analog front end of a wide-band pulse receiver. In order to apply the wide-band symmetrical triggering technology to the analog front end, the apparatus for receiving the wide-band pulse signal in the communication channel using the human body includes a bias circuit 42, a wide-band pre-amplifier 44, a Schmitt trigger 46, and an inversion buffer 48.

At this time, the bias circuit 42 provides 50-Ω matching suitable for the high-speed interface to the wide-band pulse signal transmitted through the human body as the data transmission medium and sets a DC bias of an input signal.

The wide-band pre-amplifier 44 provides a high voltage gain with respect to a wide range of frequency band and the Schmitt trigger 46 can operate at a high speed and triggers the amplified signal to a stable voltage state using the symmetrical threshold voltages.

At this time, since the signal is triggered using the symmetrical threshold voltages which are internally generated, the triggered signal has the duty cycle of 50%.

Figure 5:
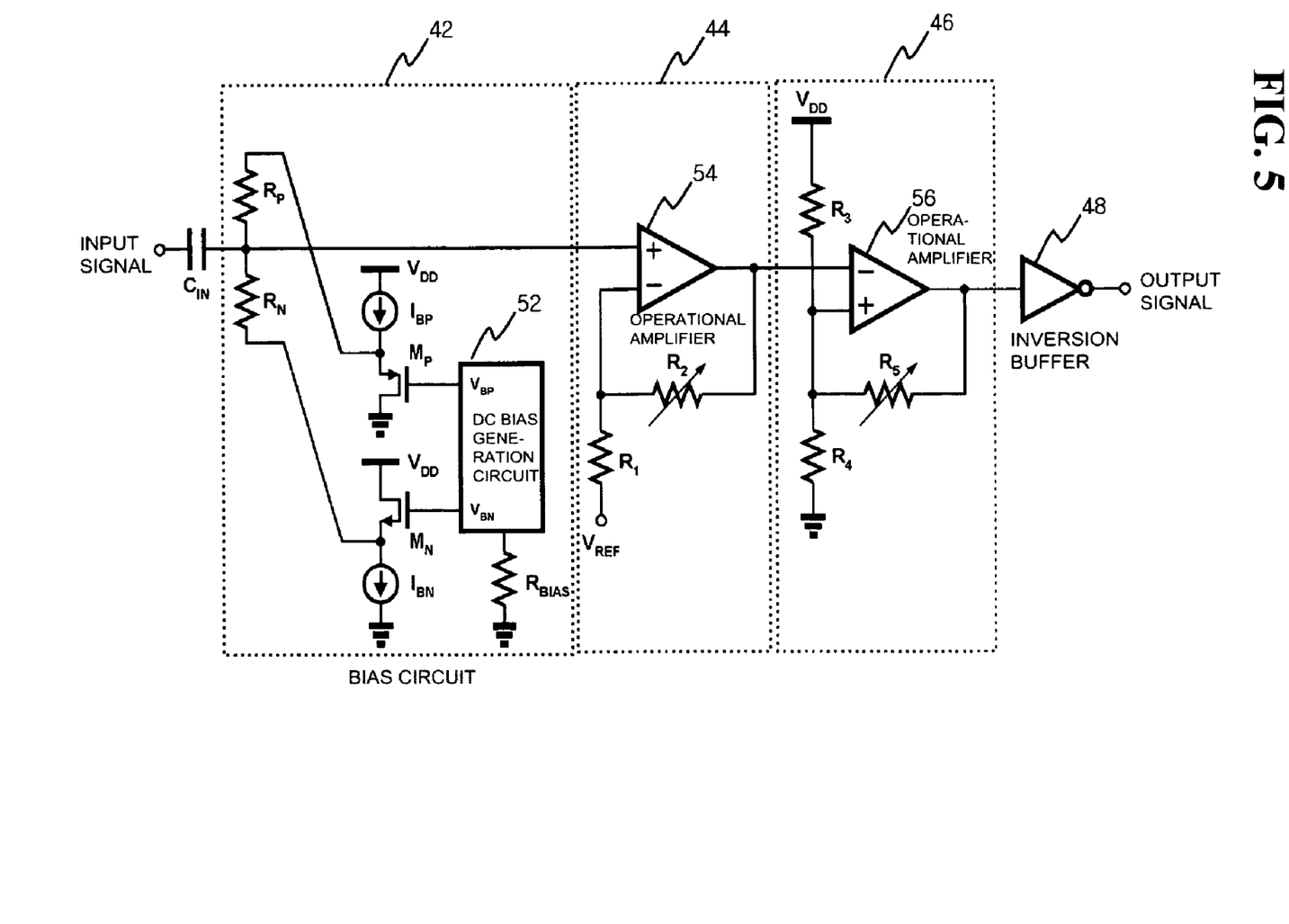
FIG. 5 is a circuit diagram showing the apparatus for receiving the wide-band pulse signal in the communication channel using the human body according to the present invention.

FIG. 5 is a circuit diagram showing the apparatus for receiving the wide-band pulse signal in the communication channel using the human body according to the present invention.

First, the pulse signal transmitted through the human body as the data transmission medium is not included in a low frequency band of a DC area. The bias circuit 42 completely blocks the conductive current between the human body and the receiving apparatus and stably holds the DC bias of the input signal regardless of a variation in DC potential of the human body. An AC coupled capacitor $C_{IN}$ is in series connected to a single reception electrode, that is, an input terminal connected with only one electrode, such that the wide-band pulse signal transmitted through the human body as the data transmission medium is received.

At this time, if a reception input impedance is $R_{IN}$, a low 3 dB-frequency $f_{L-3dB}$ is determined by $$f_{L-3dB} = \frac{1}{2\pi R_{IN} C_{IN}}.$$

At this time, since the frequency characteristics of the human-body communication channel has power of −5 dB or more in a range of 10 kHz to 100 MHz, it is sufficient that the frequency $f_{L-3dB}$ has 10 kHz or more.

However, since the reception input impedance $R_{IN}$ is as small as 50Ω and the received pulse signal is included in the frequency band of 1 MHz or more, the value of the AC coupled capacitor $C_{IN}$ is determined such that the frequency $f_{L-3dB}$ is about 1 MHz or more, in order to reduce the value of the AC coupled capacitor $C_{IN}$.

Accordingly, the bias circuit 42 includes a pair of complementary source followers $I_{BP}$-$M_P$ and $I_{BN}$-$M_N$ controlled by a DC bias generation circuit 52, a pull-up resistor $R_p$ and a pull-down resistor $R_N$.

That is, the bias circuit 42 includes the DC bias generation circuit 52 for generating the DC bias, the pair of complementary source followers $I_{Bp}$-$M_P$ and $I_{BN}$-$M_N$ controlled by the DC bias generation circuit 52, and the pull-up resistor $R_P$ and a pull-down resistor $R_N$ which are respectively connected to the output terminals of the source followers $I_{BP}$-$M_P$ and $I_{BN}$-$M_N$. A node between the pull-up resistor $R_P$ and a pull-down resistor $R_N$ is connected to an input terminal of the wide-band pre-amplifier 44.

Since the signal transmitted through the human body as the data transmission medium appears as the positive and negative symmetrical pulse signals, the bias circuit 42 is symmetrically configured in order to provide the reception input impedance of 50Ω and the bias having the same condition to the positive and negative pulse signals.

Figure 6:
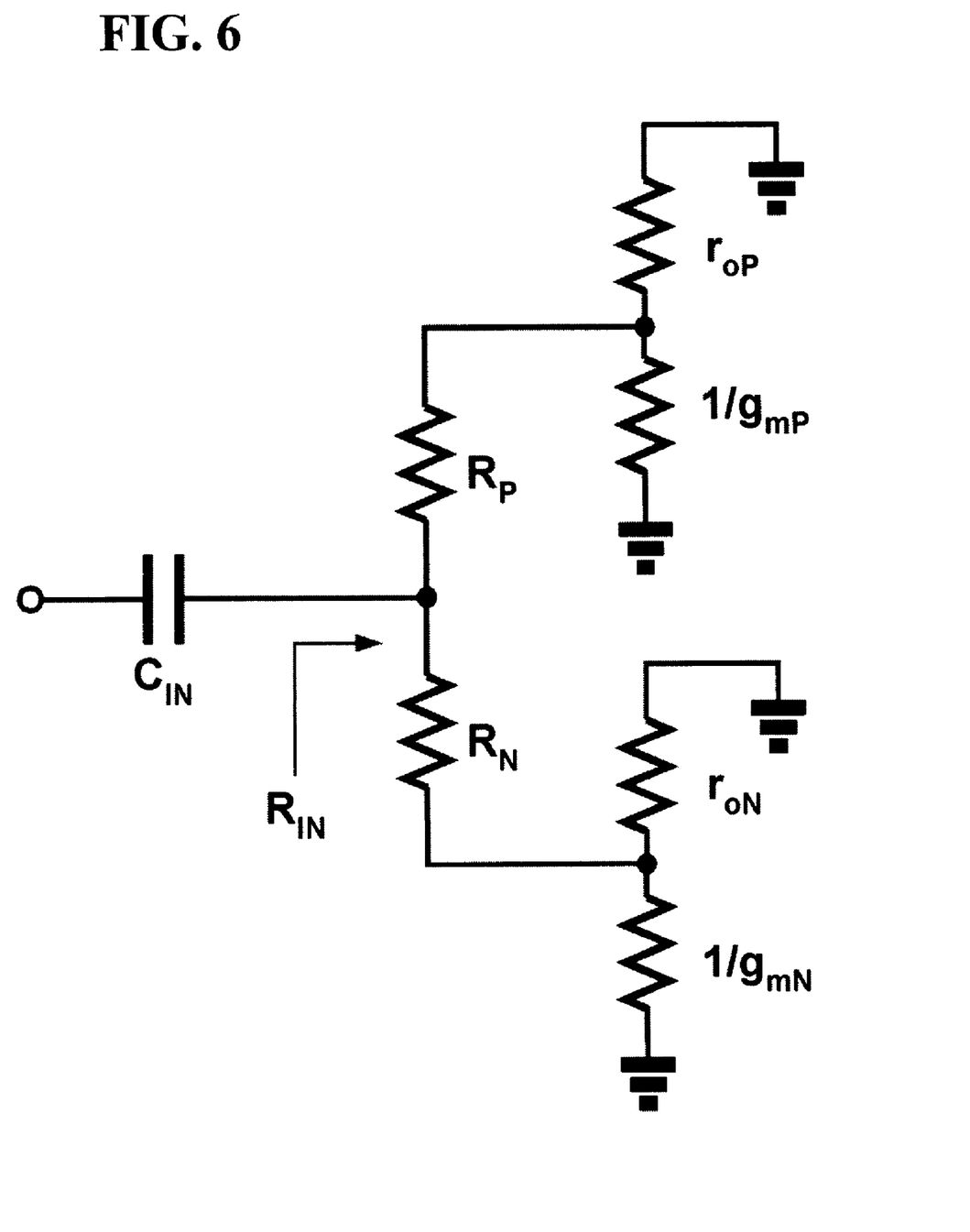
FIG. 6 is a small-signal equivalent model of an input impedance of the apparatus for receiving the wide-band pulse signal in the communication channel using the human body according to the present invention.

FIG. 6 is a small-signal equivalent model of an input impedance of the apparatus for receiving the wide-band pulse signal in the communication channel using the human body according to the present invention.

In the equivalent model, the reception input impedance $R_{IN}$ can be expressed by $$R_{IN} = \left[\left(r_{oP} // \frac{1}{g_{mP}}\right) + R_P\right] // \left[\left(r_{oN} // \frac{1}{g_{mN}}\right) + R_N\right]$$

$$\approx \left(\frac{1}{g_{mP}} + R_P\right) // \left(\frac{1}{g_{mN}} + R_N\right),$$

where, $r_{oP}$ and $r_{oN}$ are respectively output impedances of the current sources $I_{BP}$ and $I_{BN}$ and $g_{mP}$ and $g_{mN}$ are respectively transconductances of transistors $M_P$ and $M_N$.

If $R_P$=$R_N$=R and $g_{mP}$=$g_{mN}$=$g_m$, the value of the DC bias of the received pulse signal is a half of a power supply voltage $V_{DD}$ and the reception input impedance $R_{IN}$ can be simply expressed by $$R_{IN} = \frac{1 + g_m R}{2 g_m}.$$

At this time, the value of $R_{IN}$ must be 50Ω such that the reception input impedance of the bias circuit 42 has 50 Ω.

Accordingly, if the value of R is 0, the value of $g_m$ is 0.01 and the value of $R_{IN}$ is 50 Ω.

However, if the value of $R_P=R_N$ shown in FIG. 5 is 0, the AC coupled capacitor $C_{IN}$ is directly connected to the output terminals of the source followers. Accordingly, since a variation in level of the received pulse signal has directly influence on the outputs of the source followers, a drain-source voltage $V_{DS}$ of each transistor varies and the values of the current sources $I_{BP}$ and $I_{BN}$ of the source followers vary. Thus, the values of the transconductances $g_m$ of the transistors $M_P$ and $M_N$ vary and thus the reception input impedance $R_{IN}$ also varies. In contrast, noise which occurs by the power supply voltage of the source follower may have influence on the received pulse signal.

Accordingly, if the value of R is 0, the reception input impedance $R_{IN}$ significantly varies and a power supply rejection ratio (PSRR; a ratio of sensitivity to the noise of the power supply source) decreases. In contrast, if the value of R increases, the values of the transconductances $g_m$ must also increase. However, if the values of the transconductances $g_m$ increase, the values of the current sources $I_{BP}$ and $I_{BN}$ must increase and the values of the transistors $M_P$ and $M_N$ increase, thereby increasing power consumption and area consumption. Accordingly, in consideration of a relationship between R and $g_m$, the values of R and $g_m$ are adequately selected.

Figure 7:
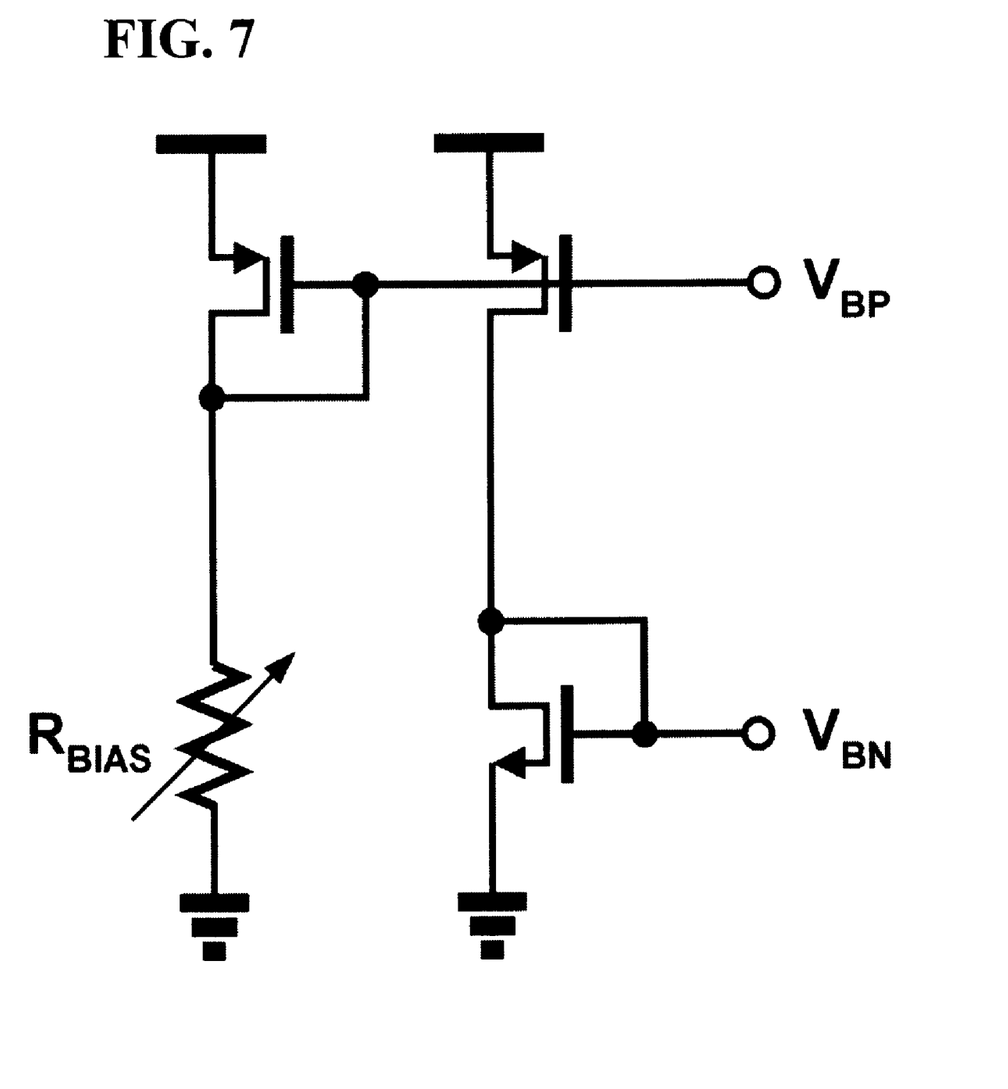
FIG. 7 is a circuit diagram showing a DC bias generation circuit of a bias circuit in the apparatus for receiving the wide-band pulse signal in the communication channel using the human body according to the present invention.

FIG. 7 is a circuit diagram showing the DC bias generation circuit of the bias circuit of the apparatus for receiving the wide-band pulse signal in the communication channel using the human body according to the present invention.

Since the values of $V_{BP}$ and $V_{BN}$ vary depending on the value of $R_{BIAS}$, desired bias values of the current sources can be selected.

As shown in FIG. 5, the wide-band pre-amplifier 44 includes a low-power wide-band non-inversion operational amplifier 54 for adjusting a feedback resistor to adjust a voltage gain in order to have an infinite input impedance. The voltage gain $A_v$ can be expressed by $$A_v = \frac{V_{OUT}}{V_{IN}} = 1 + \frac{R_2}{R_1}.$$

As can be seen from this equation, it is possible to simply adjust the voltage gain by adjusting the value of the feedback resistor $R_2$.

At this time, since the bias value of the input signal of the wide-band preamplifier 44 is a half of the power supply voltage $V_{DD}$, a reference voltage $V_{REF}$ which corresponds to a half of the power supply voltage $V_{DD}$ is applied to one side of the resistor $R_2$.

If an operation frequency band of the receiving apparatus according to the present invention is in a range of $f_{L-3dB}$ to $f_{H-3dB}$, the low 3-dB frequency $f_{L-3dB}$ is determined by the AC coupled capacitor $C_{IN}$ and the reception input impedance $R_{IN}$ as described above and the high 3-dB frequency $f_{H-3dB}$ is determined by the 3-dB frequency of the wide-band pre-amplifier 44.

That is, if a DC voltage gain of the operational amplifier 54 is $A_o$, a 3-dB frequency is $f_{o-3dB}$ and a feedback loop gain is b, $f_{H-3dB}$ is determined by $$f_{H-3dB} = (1 + \beta A_o) f_{o-3dB}$$
$$= \left(1 + \frac{R_1}{R_1 + R_2} A_o\right) f_{o-3dB}.$$

At this time, when a ratio of $R_2$ to $R_1$ increases in order to obtain a high voltage gain, $f_{H-3dB}$ can be determined by $$f_{H-3dB} \approx \frac{R_1}{R_2} A_o f_{o-3dB}.$$

By this equation, it can be seen that there is a trade-off relationship between the high voltage gain and the wide operation frequency band.

Accordingly, since the received pulse signal is included in a frequency band of 200 MHz or less, a maximum voltage gain is determined such that $f_{H-3dB}$ becomes 200 MHz and the voltage gain is adjusted to be less than or equal to the maximum voltage gain.

In addition, the Schmitt trigger 46 includes an inversion operational amplifier 56 of which an inversion terminal is connected to an output terminal of the wide-band pre-amplifier 44. Two resistors $R_3$ and $R_4$ having the same values are connected between the power supply voltage and the ground GND and a node between the resistors $R_3$ and $R_4$ is connected to a non-inversion terminal of the operational amplifier 56 and a feedback resistor $R_5$. The operational amplifier 56 adjusts a threshold voltage by adjusting the feedback resistor $R_5$.

Accordingly, the value of the DC bias of the output signal of the wide-band pre-amplifier 44 is $\frac{1}{2}V_{DD}$. When the values of resistors $R_3$ and $R_4$ are equal, the Schmitt trigger 46 including the three resistors $R_3$, $R_4$ and $R_5$ can operate at a high speed, internally generate the positive and negative symmetrical threshold voltages on the basis of $\frac{1}{2}V_{DD}$ and simply adjust the threshold voltage by the feedback resistor $R_5$.

The digital signal having the duty cycle of 50% can be restored by the symmetrical triggering.

Accordingly, it is possible to remove necessities of the external reference voltage which is the problem of the prior art. The positive and negative threshold voltages $V_{TH}$ and $V_{TL}$ of the Schmitt trigger 46 are determined by $$V_{TH} = \frac{R_4}{R_3 // R_5 + R_4} V_{DD}$$
$$V_{TL} = \frac{R_4 // R_5}{R_3 + R_4 // R_5} V_{DD}.$$

By this equation, the reception sensitivity $(V_{RX})_{min}$ is $$(V_{RX})_{min} = \frac{V_{TH} - \frac{1}{2}V_{DD}}{A_V} (V_{TH} + V_{TL} = V_{DD}).$$

Since the symmetrical threshold voltages are obtained by $R_3=R_4$, a relationship of $V_{TH}+V_{TL}=V_{DD}$ is satisfied.

Accordingly, the reception sensitivity of the apparatus for receiving the wide-band pulse signal according to the present invention can be reduced by the adjusting the symmetrical threshold voltages of the Schmitt trigger 46 and the voltage gain of the wide-band pre-amplifier 44.

If the power supply voltage is 1 V, the voltage gain of the wide-band pre-amplifier 44 is 50 V/V, and the threshold voltage range is 300 mV, $V_{DD}=1V$, $V_{TH}=650$ mV and $A_V=50/V$ and thus the reception sensitivity $(V_{Rx})_{min}$ is 3 mV. Accordingly, it is possible to provide a minimum reception sensitivity which can solve the limitation of the reception sensitivity, which is the problem of the prior art.

In addition, it is possible to provide optimal reception sensitivity according to a communication distance by adjusting the values of $R_2$ and $R_5$.

Since the input signal of the Schmitt trigger 46 is also in the wide band of 100 MHz or more, the operational amplifier 56 of the Schmitt trigger 46 has the same configuration as the operational amplifier 54 of the wide-band pre-amplifier 44, for design convenience.

Figure 8:
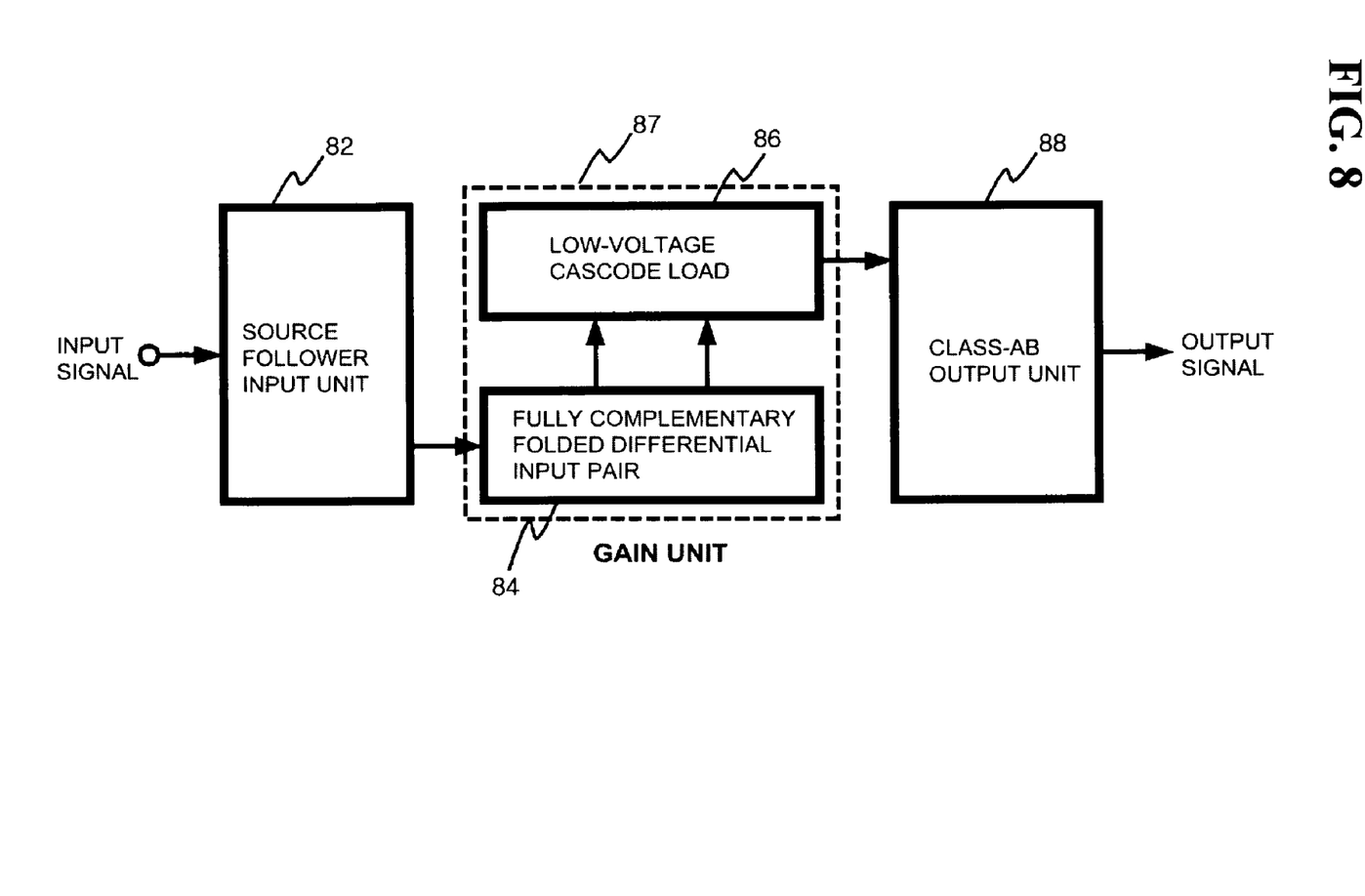
FIG. 8 is a circuit diagram showing an operational amplifier used in the apparatus for receiving the wide-band pulse signal in the communication channel using the human body according to the present invention.

Since the operational amplifiers 54 and 56 must operate in the wide band of 100 MHz or more, the power consumption may increase. Accordingly, since the received input signal has the positive and negative pulse signals, for the symmetrical operation, a fully complementary folded cascode structure may be provided as shown in FIG. 8 such that the power consumption is reduced and a wide-band operation is possible.

As shown, the operational amplifier includes a source follower input unit 82, a gain unit 87 including a fully complementary folded differential input pair 84 for amplifying a signal input through the source follower input unit 82 and a low-voltage cascode load 86, and a class-AB output unit 88 for outputting a signal amplified by the gain unit 87.

Since the power consumption of an analog circuit is proportional to the power supply voltage, when the power supply voltage decreases, the power consumption decreases. Accordingly, in order to obtain a high voltage gain at a low power supply voltage, the gain unit 87 is divided into two units and uses the low-voltage folded cascode structure. Since an overdrive voltage $(V_{DS})_{SAT}=V_{GS}-V_{TH}$ necessary for each transistor is not sufficiently large at the low power supply voltage, the input unit 82 is composed of a source follower for increasing or decreasing an input voltage bias in order to sufficiently increase the overdrive voltage necessary for the differential input pair and to reduce the area of the circuit. In order to provide a high slew rate at the low power and provide symmetrical output signals, the output unit 88 is of a class-AB type.

Finally, since the Schmitt trigger 46 inverts the phase of the input pulse signal and triggers the inverted pulse signal, the inversion buffer 48 having sufficient driving capability restores the received pulse signal to the digital signal having the same phase. Accordingly, it is possible to restore a high-speed wide-band pulse signal to a digital signal with low power consumption in a communication channel using a human body as a data transmission medium.

As described above, according to the present invention, when a weak wide-band pulse signal, which is output from a communication channel using a human body as a data transmission medium, is restored to a digital signal, it is possible to accomplish low power consumption and high data transmission rate using a wide-band symmetrical triggering technology using 50-Ω impedance matching, wide-band amplification and symmetrical threshold voltages. In addition, since only a single signal electrode is used, it is possible to provide an apparatus having usability, wearability and miniaturization.

By dividing a signal amplification function and a comparison function through the wide-band symmetrical triggering technology, it is possible to significantly decrease reception sensitivity. In addition, it is possible to remove necessities of an external reference voltage to reduce area consumption and to simply adjust a feedback resistor to easily adjust the reception sensitivity according to a communication distance.

In addition, by providing an operational amplifier having a fully complementary folded cascode structure, it is possible to reduce power consumption and to accomplish a wide-band operation.

Although the preferred embodiments of the present invention have been disclosed, those skilled in the art will appreciate that various modifications, additions and substitutions are possible, without departing from the scope and spirit of the invention as disclosed in the accompanying claims.

What is claimed is:

1. An apparatus for receiving a wide-band pulse signal in a communication channel using a human body, the apparatus comprising:
   a bias circuit which sets a DC bias with respect to the wide-band pulse signal transmitted through the human body as a data transmission medium;
   a wide-band pre-amplifier which provides a high voltage gain to the pulse signal having the DC bias set by the bias circuit over a wide range of frequency band;
   a Schmitt trigger which triggers the pulse signal amplified by the wide-band pre-amplifier to a stable voltage state using symmetrical threshold voltages; and
   an inversion buffer which inverts the pulse signal triggered by the Schmitt trigger and outputs a digital signal having the same phase as the received signal.

2. The apparatus according to claim 1, wherein only one electrode is connected to an input terminal such that the wide-band pulse signal transmitted through the human body as the data transmission medium is received.

3. The apparatus according to claim 1, wherein a reception input impedance of the bias circuit is 50 W.

4. The apparatus according to claim 3, wherein the bias circuit comprises:
   a DC bias generation circuit which generates the DC bias;
   a pair of complementary source followers which is controlled by the DC bias generation circuit; and
   a pull-up resistor and a pull-down resistor which are connected between respective output terminals of the source followers in series,
   wherein a node between the pull-up resistor and the pull-down resistor is connected to an input terminal of the wide-band pre-amplifier.

5. The apparatus according to claim 1, further comprising an AC coupled capacitor which is in series connected to an input terminal for receiving the signal transmitted through the human body as the data transmission medium.

6. The apparatus according to claim 1, wherein the bias circuit comprises:
   a DC bias generation circuit which generates the DC bias;
   a pair of complementary source followers which is controlled by the DC bias generation circuit; and
   a pull-up resistor and a pull-down resistor which are connected between respective output terminals of the source followers in series,
   wherein a node between the pull-up resistor and the pull-down resistor is connected to an input terminal of the wide-band pre-amplifier.

7. The apparatus according to claim 1, wherein the wide-band pre-amplifier comprises a non-inversion operational amplifier which adjusts a feedback resistor to adjust the voltage gain.

8. The apparatus according to claim 7, wherein the operational amplifiers of the wide-band pre-amplifier and the Schmitt trigger have a hilly complementary folded cascode structure.

9. The apparatus according to claim 8, wherein each of the operational amplifiers comprises:

a source follower input unit;

a gain unit including a fully complementary folded differential input pair for amplifying a signal input through the source follower input unit and a low-voltage cascode load; and a class-AB output unit which outputs a signal amplified by the gain unit.

10. The apparatus according to claim 1, wherein the Schmitt trigger comprises an inversion operational amplifier of which an inversion terminal is connected to an output terminal of the wide-band pre-amplifier, two resistors having a same value are connected between a power supply voltage and ground, a node between the two resistors is connected to a non-inversion terminal of the inversion operational amplifier and a feedback resistor, and the inversion operational amplifier adjusts the feedback resistor to adjust the threshold voltages.

11. The apparatus according to claim 10, wherein the operational amplifiers of the wide-band pre-amplifier and the Schmitt trigger have a fully complementary folded cascode structure.

12. The apparatus according to claim 1, wherein the triggered pulse signal has a duty cycle of 50%.

* * * * *